United States Patent
White

(10) Patent No.: US 6,542,363 B2
(45) Date of Patent: Apr. 1, 2003

(54) SELF-ACTUATED DAMPER FOR PREVENTING AIR FLOW THROUGH EMPTY SLOTS OF A MODULAR CIRCUIT BOARD CAGE

(75) Inventor: Joseph M. White, Windsor, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 162 days.

(21) Appl. No.: 09/803,493

(22) Filed: Mar. 9, 2001

(65) Prior Publication Data

US 2002/0124886 A1 Sep. 12, 2002

(51) Int. Cl.⁷ ................................................. H05K 7/20
(52) U.S. Cl. ....................... 361/695; 454/184

(58) Field of Search ........................... 361/695; 454/184

(56) References Cited

2002/0093788 A1 * 7/2002 Rothschild .................. 361/685

* cited by examiner

Primary Examiner—Gerald A. Michalsky

(57) ABSTRACT

A self-actuating damper for each slot of a multi-slot printed circuit board assembly cage allows proper air-cooling without regard to the presence or non-presence of card board assemblies in the slots. The damper of each slot is automatically held in the closed position when the respective slot is empty. An actuation hook implemented on each of the card board assemblies engages the actuator of the damper as card board assembly is aligned with the slot and automatically actuates the damper to an open position as the cell board assembly is inserted into the slot.

8 Claims, 11 Drawing Sheets

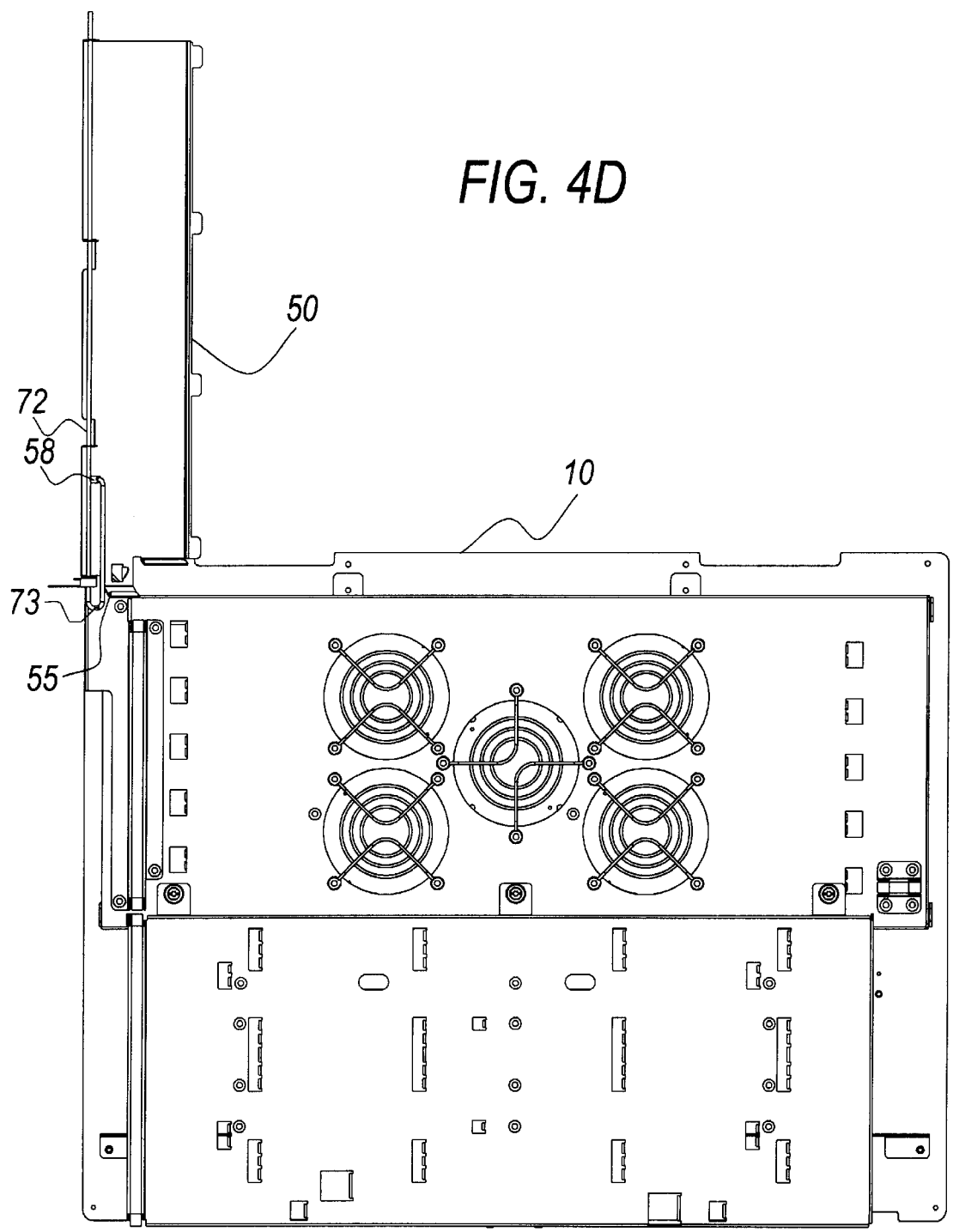

SELF-ACTUATED DAMPER FOR PREVENTING AIR FLOW THROUGH EMPTY SLOTS OF A MODULAR CIRCUIT BOARD CAGE

FIELD OF THE INVENTION

The present invention pertains generally to electronic circuit cooling, and more particularly, to a self-actuated damper and actuation mechanism for preventing air flow through empty slots of a module circuit board cage.

BACKGROUND OF THE INVENTION

Proper airflow across a printed circuit board (PCB) is important for transferring heat away from the electronic components. PCBs are used in a wide variety of electronic equipment, especially equipment incorporating microprocessors, which can generate significant amounts of heat. Typically, such PCBs include one or more microprocessors and other heat-generating components, with one or more heat sinks also mounted on the board. Conventional cooling techniques employ a fan or blower to direct a tangential flow of air across the PC board and heat sinks, to cool the components by convection.

Heat dissipation is a more difficult problem to address when the electronic equipment incorporates numerous microprocessors or other components and modules generating large amounts of heat. Some high-end servers, for example, can house assemblies containing as many as 64 microprocessors, with associated memory devices and ASICs, dissipating up to 12 kilowatts. Unless properly addressed, the heat dissipated by these large assemblies can cause component damage. Accordingly, the importance of proper cooling through methods such as the use of heat sinks, air-cooling fans, and liquid cooling methods, is ever increasing.

PCB assemblies, also referred to herein as card board assemblies, are often housed with other like assemblies in a modular cage which provides a common cooling system for each of the card board assemblies inserted in the cage. In a modular assembly comprising one to many circuit boards, both the presence and placement of the number of boards can affect the evenness of the airflow across each of the boards. In a system utilizing air coolant fans to generate air flow across the assemblies housed in the cage through air flow entrances on one side and out air flow exits on the opposite side, the air flow is generally distributed evenly across each of the assemblies in the cage if the cage is full (i.e., each slot contains a card board assembly). However, if one or more slots are empty, air forced in one side of the cage by the fans will, unless otherwise manipulated, generally flow through the path of least resistance—namely, through the empty slot(s) and out the air flow exits of the empty slots. Thus, when one or more slots are empty, significant amounts of air flow will generally bypass the card assembly boards that are housed in the cage, causing improper cooling of these assemblies. Accordingly, a need exists for ensuring delivery of more evenly distributed air flow in multi-slot PCB assembly cages regardless of the number and positions of card board assemblies inserted in the cage.

Prior art fan cooling methods address this problem by increasing the power of the fans and/or through adjusting the placement of the fans. In an ideal fan cooling system for a modular assembly, the design should be such to ensure even airflow across all PCBs present in the assembly, regardless of the number and placement of the boards. This method, however, requires higher power consumption and may not necessarily provide proper cooling levels to all assemblies. Accordingly, a need exists for a method for providing proper and even cooling across all assemblies present in the cage without the application of higher power fans.

BRIEF DESCRIPTION OF THE DRAWINGS

The invention will be better understood from a reading of the following detailed description taken in conjunction with the drawing in which like reference designators are used to designate like elements, and in which:

FIG. 4D is a bottom view of a cell board assembly and the damper as the cell board assembly as the cell assembly board is partially inserted in the cell slot such that the damper is partially opened.

SUMMARY OF THE INVENTION

In accordance with the invention, in a multi-slot PCB assembly cage, each slot is provided with a self-actuation damper that switches between a closed position covering an air flow exit opening to an open position allowing free flow of air through the air flow exit. Cell board assemblies housed in the cage are each equipped with an actuation hook which engages the damper of the respective slot as when the cell board assembly is aligned for insertion into the slot. As the cell board assembly is inserted further and further into the slot, the damper moves from the closed position to the open position.

DETAILED DESCRIPTION OF THE INVENTION

Figure 1A:
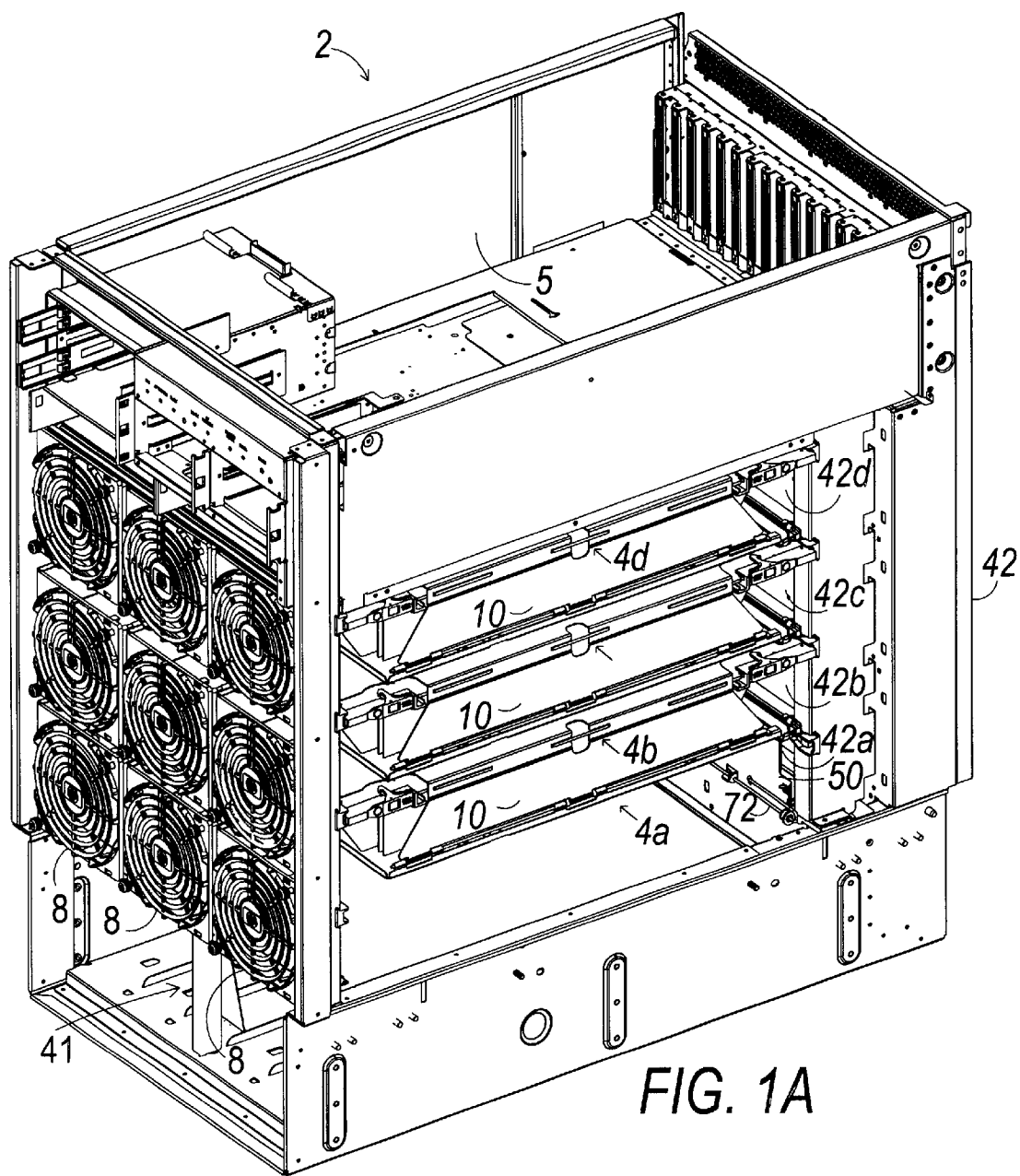
FIG. 1A is an isometric view of a modular assembly cage.

FIG. 1A illustrates a modular assembly cage 2 comprising four cell assembly slots 4a, 4b, 4c, 4d. Each cell assembly slot 4a, 4b, 4c, 4d is capable of housing a cell assembly board 10, which is inserted into a respective slot, guided into place along card guides 60 of the slot, and seated against a backplane 5 via edge connector seats (not shown) using well-known methods. In the preferred embodiment, the backplane 5 forms the rear panel of the cage, generally sealing any significant amount of air flow from passing out the rear of the cage 2. For illustration purposes, cell assembly slot 4a is empty, while slots 4b, 4c, and 4d each house a respective cell assembly board 10.

Figure 1B:
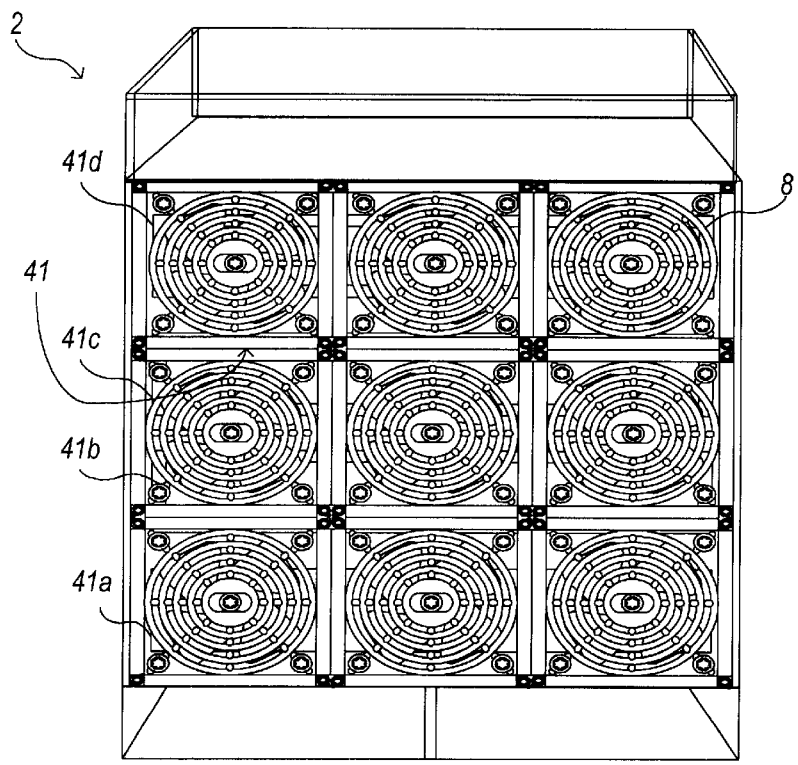
FIG. 1B is a side view of the modular assembly cage on the side on which air enters the assembly cage.

FIG. 1B shows the modular assembly cage 2 from the side 41 on which the fans 8 are mounted. Rotary fans 8 are attached to the open walls of the slots to blow air into the slots 4a, 4b, 4c, 4d. Air passes through the fans 8 through air flow entrance openings 41a, 41b, 41c, and 41d in each respective slot 4a, 4b, 4c, and 4d on side 41.

Figure 1C:
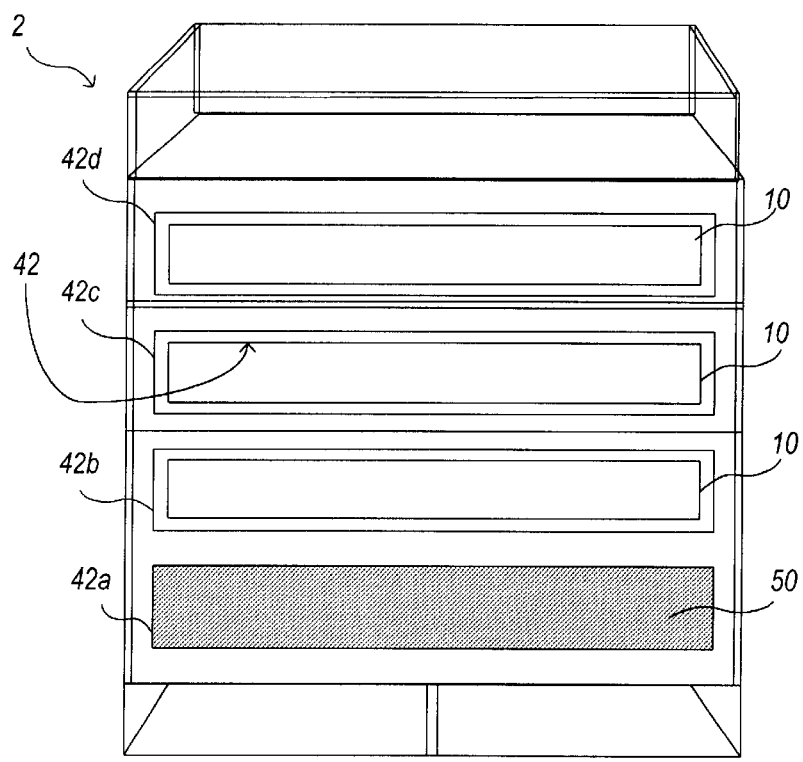
FIG. 1C is a side view of the assembly cage on the side on which air exits the assembly cage.

FIG. 1C shows the modular assembly cage 2 from the side 42 at which cooling air exits the cage. As shown, the walls of slots 4b, 4c, and 4d on side 42, herein referred to as air exit openings 42a, 42b, 42c, 42d, are open to allow the air blowing through the respective cell assemblies 10 housed in the slots 4b, 4c, and 4d to exit. As also shown, the air exit opening 42a of slot 4a is covered by a damper 50 to prevent air from passing through it. Since air flow passes through the path of least resistance, the damper 50 prevents the cooling air entering the cage from side 41 from bypassing the paths through cell assembly boards 10 in slots 4b, 4c, and 4d to "short-circuit" through empty slot 4a and out its air exit opening 42a. With the damper 50 in place, the air inside empty slot 4a must pass through one of the air exit openings 42b, 42c, and/or 42d of slots 4b, 4c, and/or 4d, thus preventing "short-circuiting" of the air flow through the open slot(s) 4a.

Figure 2A:
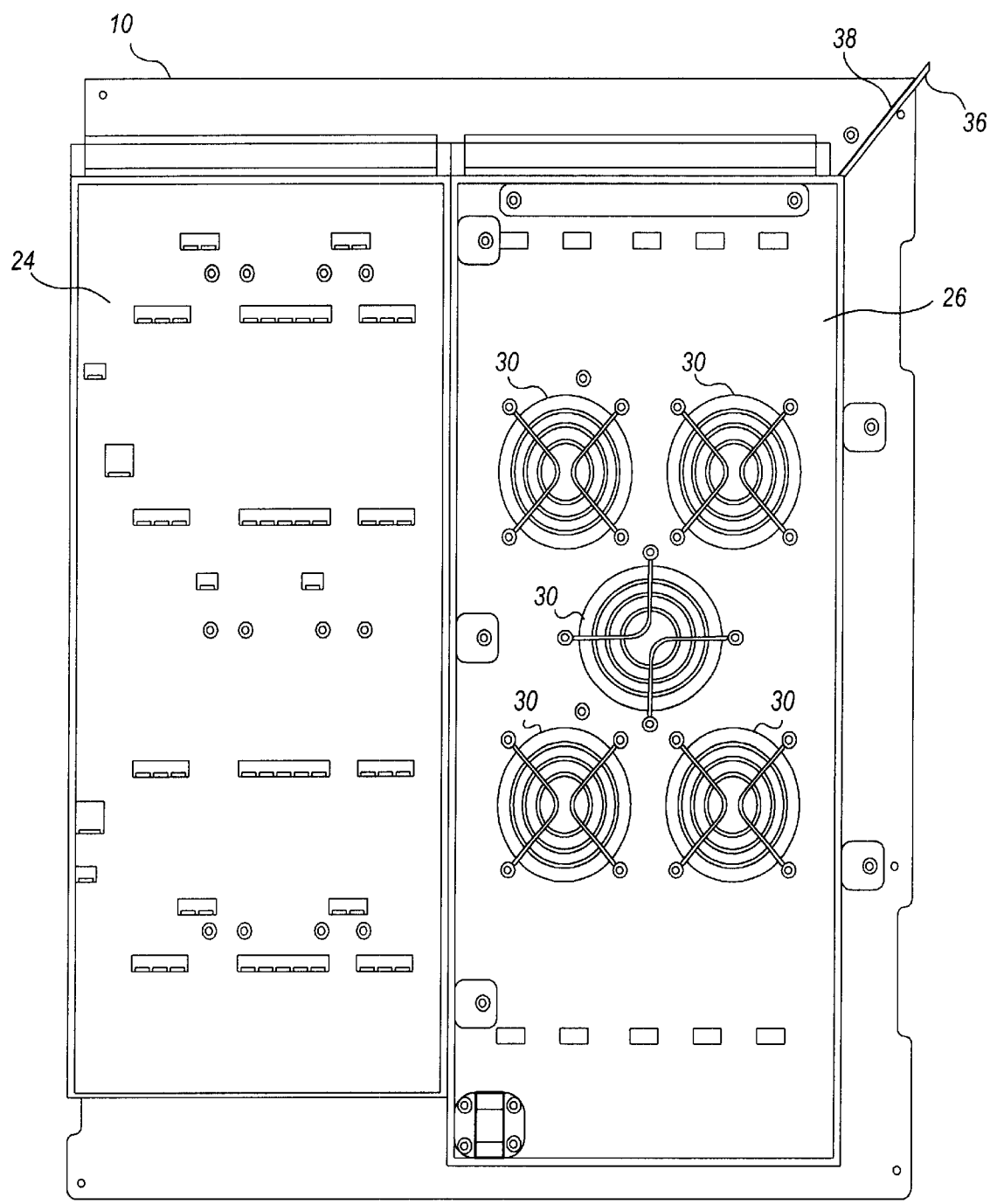
FIG. 2A is a bottom view of a cell assembly board.
Figure 2B:
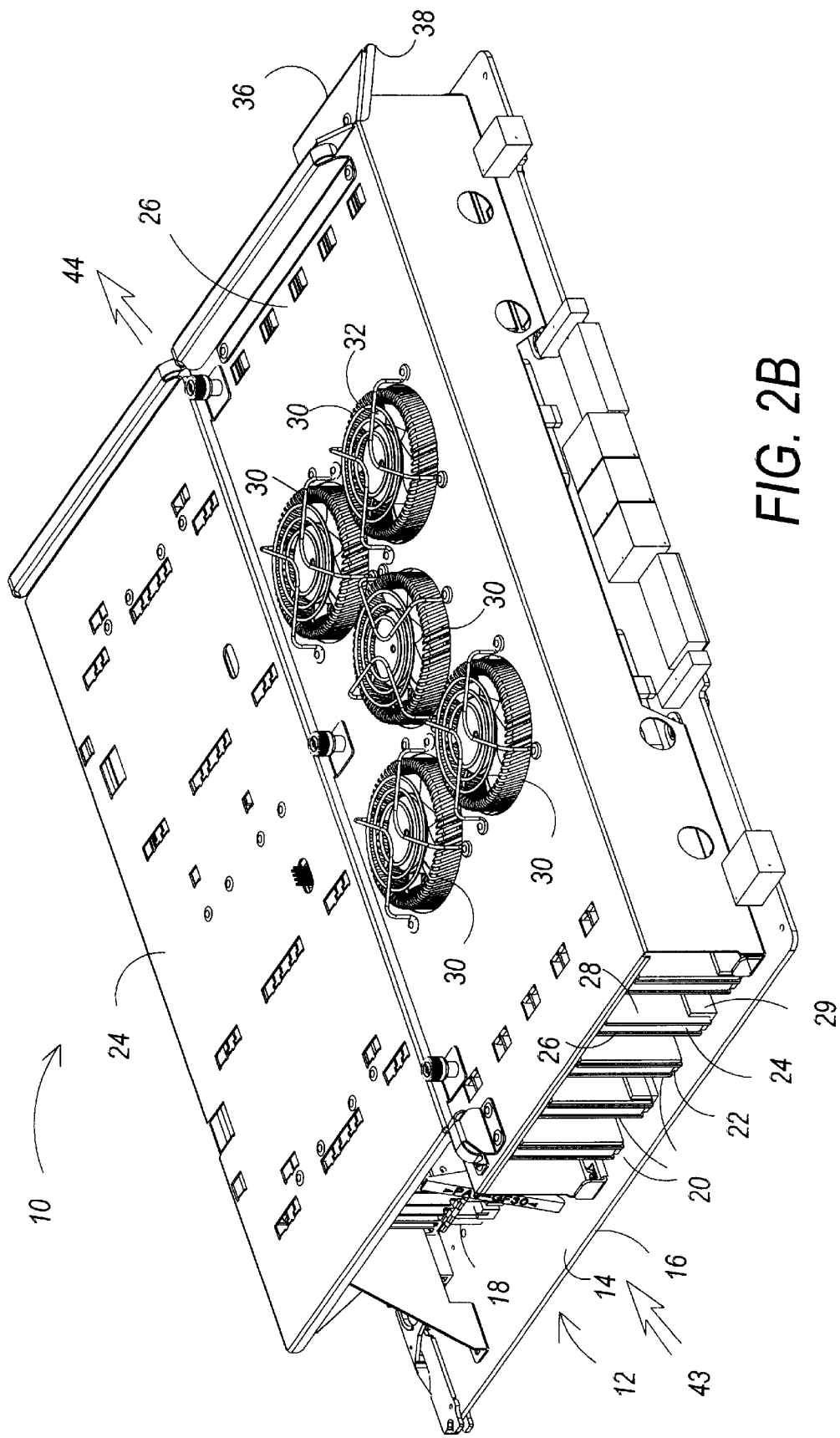
FIG. 2B is an isometric view of the cell assembly board of FIG. 2A.

FIG. 2A is a bottom view and FIG. 2B is an isometric bottom view of a cell assembly board 10. As illustrated, cell assembly board 10 comprises a main cell board 12 comprising a printed circuit board (PCB) 14 with a belly plate 16 mounted to its bottom plane for protection. PCB 14 comprises the main system board for the cell assembly. PCB 14 typically includes one or more microprocessors, peripheral interface ICs, edge and/or slot connectors which connect modular circuit boards 20 and peripheral components within the cell assembly, and various other surface- and/or solder-mounted electronic components. Modular circuit boards typically include memory modules, voltage regulator modules, etc., and are connected by seating the module connector within the seat connectors 22 (edge or slot connector) of the main PCB 14 using well-known methods.

In the embodiment shown, modular circuit boards 20 include voltage regulator modules 24 comprising two printed circuit boards 26 and 28, one of which 28 is attached to an aluminum heat sink 29 that is cooled by the passing airflow, discussed hereinafter. The voltage regulator modules 24 in the illustrative embodiment convert a 48 V system board power supply to 1.5 V required by the processors (not shown) surface mounted on the main cell board PCB14.

A set of cylindrical turbo heat sinks 30 attach to the main cell board 12 and encase a set of respective fans 32, preferably a DC brushless rotary model, to provide cell board assembly cooling, as discussed hereinafter.

In the embodiment shown, modular circuit boards 20 also include dual in-line memory modules 18, which provide the system memory for the cell assembly. A dual in-line memory module (DIMM) cover 24 is mounted over the memory modules 18 and attached to the main cell board 12 using screws or other known attachment means.

A baffle 26 is mounted over the remaining portion of the main cell board 12, covering modular circuit boards 20 and sealed around the heat sinks 30 as shown, attaching to the main cell board 12 using conventional attachment means. The fans 32 operate to propagate air flow from outside one end 41 of the baffle 26 and DIMM cover 24, through the inside airspace between the main cell board 12 and the baffle 26 and DIMM cover 24, and out the other end 42 of the baffle 26 and DIMM cover 24, as indicated by the direction of arrows at 43 and 44, to provide cooling airflow to all components of the cell bed assembly 10 inside the enclosed space.

The cell board assembly 10 includes an actuation mechanism 36 used to actuate the damper (discussed hereinafter) as the cell board assembly 10 is inserted into one of the cell assembly slots 4a, 4b, 4c, 4d of the modular assembly cage 2 of FIG. 1. In the preferred embodiment of the invention, the actuation mechanism 36 takes the form of an actuation hook formed on the bottom corner insertion end (shown upside down) of the baffle 26 on the side of the cell board assembly 10 that will engage the damper 50 (in this embodiment, side 42 of the cage 2). As shown in FIG. 2B, the actuation hook 36 is a right-angle extension extending along the top plane of the baffle 26 from corner 45, and tapering to a point 38. Operation of the actuation hook 36 is described in detail hereinafter.

In the illustrative embodiment, the actuation hook 36 is formed as part of the baffle 26. However, those skilled in the art will appreciate that the cell assembly may take various forms, and the invention is intended to cover any cell assembly implementation that includes an actuation hook that triggers self-actuation of a self-actuating damper upon insertion of the cell board assembly 10 into a cell slot 4a, 4b, 4c, 4d.

Figure 3A:
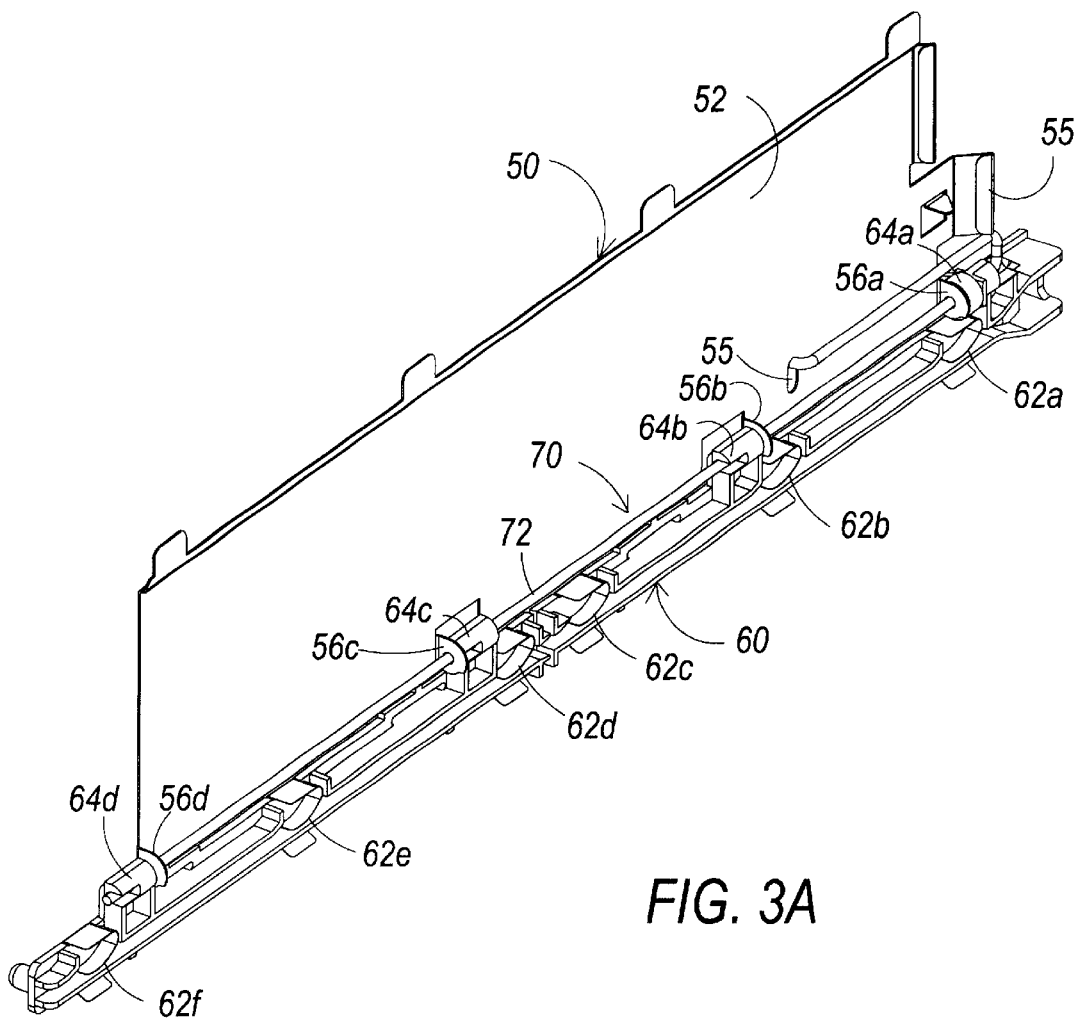
FIG. 3A is an isometric view of the damper, hinge, and card guide assembly.
Figure 3B:
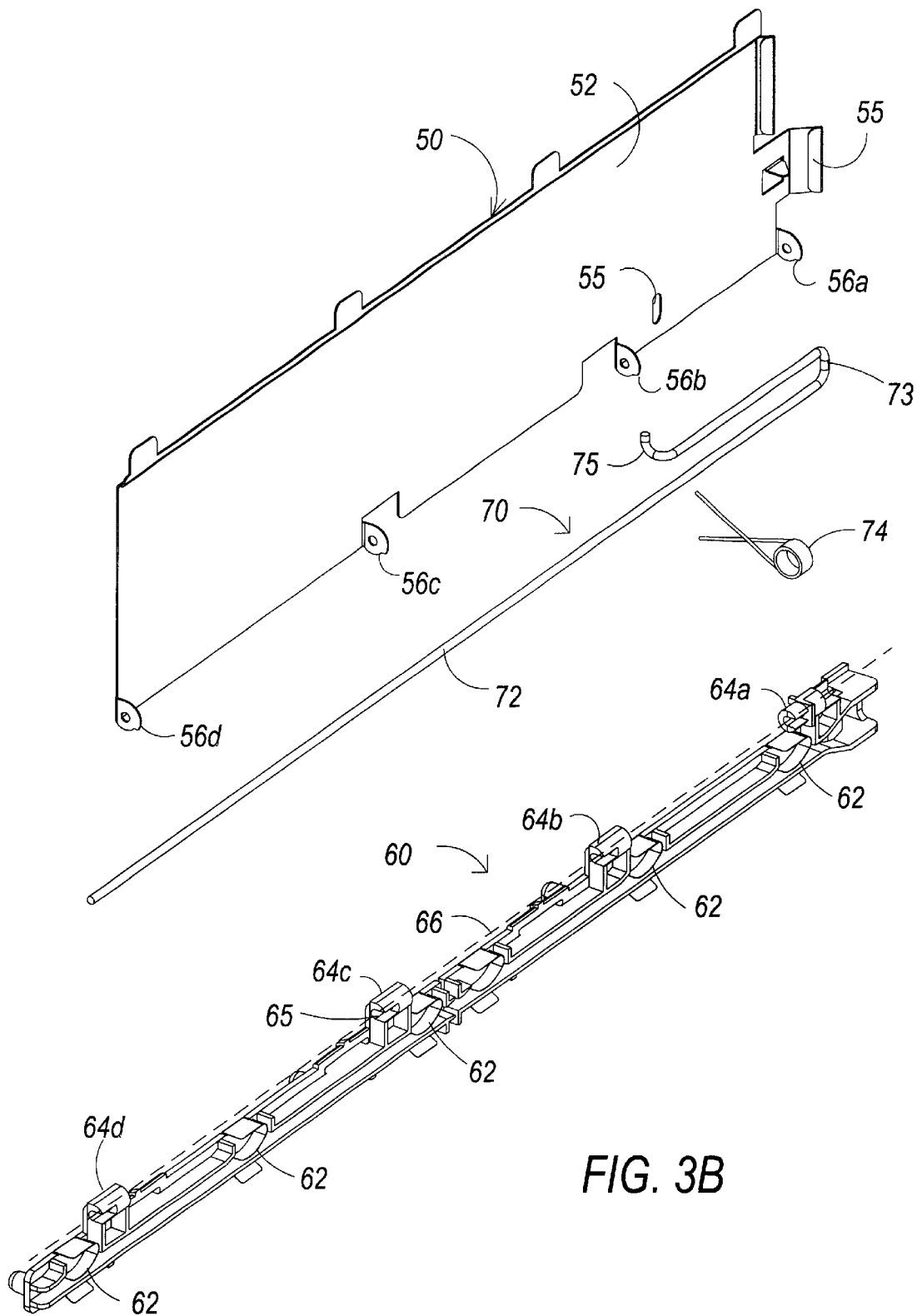
FIG. 3B is an exploded view of the damper, hinge, and card guide assembly of FIG. 3A.

The damper will now be described in conjunction with FIGS. 3A and 3B. As illustrated in FIG. 1C, without any actuation, the damper 50 is designed to cover the wall of its respective slot on the exit side 42 of the cage 2. In the preferred embodiment, the damper 50 comprises a body 52 that fully covers the wall opening of the slot, an actuator 55, one or more stops 54a, 54b, 54c, 54d, and a plurality of folded tabs 56a, 56b, 56c, each having a hollow opening. The damper 50 is attached to a card guide 60, which is attached along the bottom edge of the slot below the air flow exit opening 42a by a hinge assembly 70.

The card guide 60 operates as a guide for the cell assembly board 10 in order to properly align it as it is inserted in the slot 4a, 4b, 4c, 4d. On the air flow exit side 42 of the cage 2, the card guide 60 includes a set of wire guides 64a, 64b, 64c, 64d each having a hollow tube 65 therethrough such that the axis 66 of the hollow tube 65 of each wire guide 64a, 64b, 64c, 64d is aligned with the axis of each of the other hollow tubes.

To attach the damper 50 to the card guide 60, the damper tabs 56a, 56b, 56c, 56d are aligned with the respective wire guides 64a, 64b, 64c, 64d on the card guide 60 and a wire 72 is threaded through the holes of each of the tabs and wire guides. Wire 72 forms a U-curve 73 at one end, and one end 75 of the wire is hooked through the damper body 52 through a hollow notch 58. The hinge assembly 70 allows rotation of the damper 50 from a fully closed position against the air flow exit opening to a fully open position at a right angle from the closed position.

The card guide 60 also includes a set of return springs 62 which, when the slot is empty, exert force on the damper 50, especially at the U-curve in the wire, to push the damper in an upright position against the air flow exit opening of the slot. The stops 54 of the damper 50 prevent the damper from being pushed out through the air flow exit opening. Accordingly, when the slot is empty, the damper 50 is held in the fully closed position against and planar to the wall opening, completely covering it, by return springs 62a, 62b, 62c, 62d, 62e, 62f attached to the card guide 60.

Figure 4A:
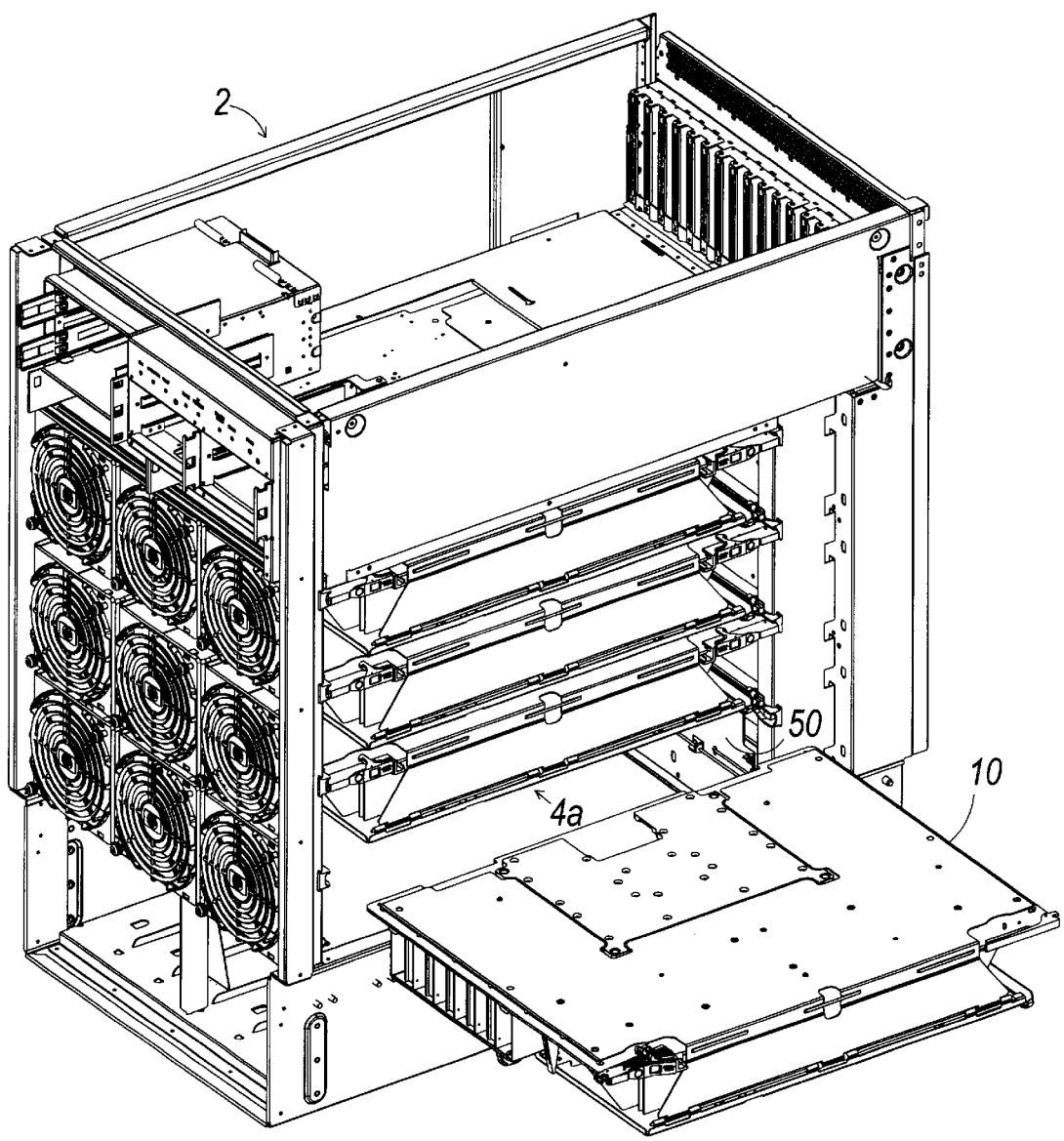
FIG. 4A is an isometric view of a cell board assembly and cage as the cell board assembly is aligned to the entrance of a slot prior to insertion in the slot.

FIG. 4A is an isometric view of a cell board assembly and cage as the cell board assembly is aligned to the entrance of a slot prior to insertion into slot 4a. As shown, cell board assembly 10 is now upright with the actuation hook on the bottom right hand insertion side (out of view). As also shown, damper 50 in slot 4a is in the fully closed position, preventing air flow from exiting through air exit opening 42a.

Figure 4B:
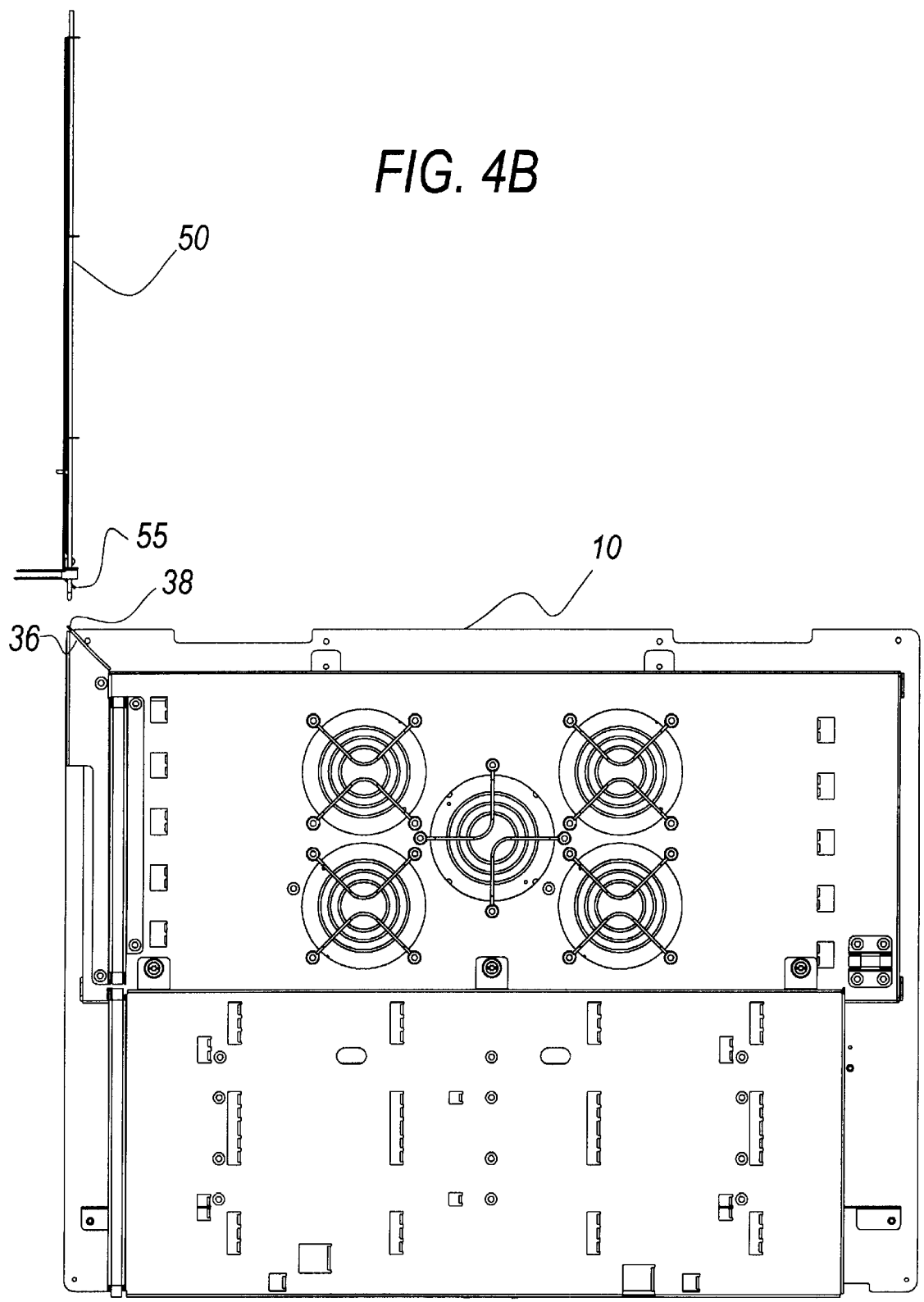
FIG. 4B is a bottom view of a cell board assembly and the damper as the cell board assembly is aligned to the entrance of the slot prior to insertion in the slot.
Figure 4C:
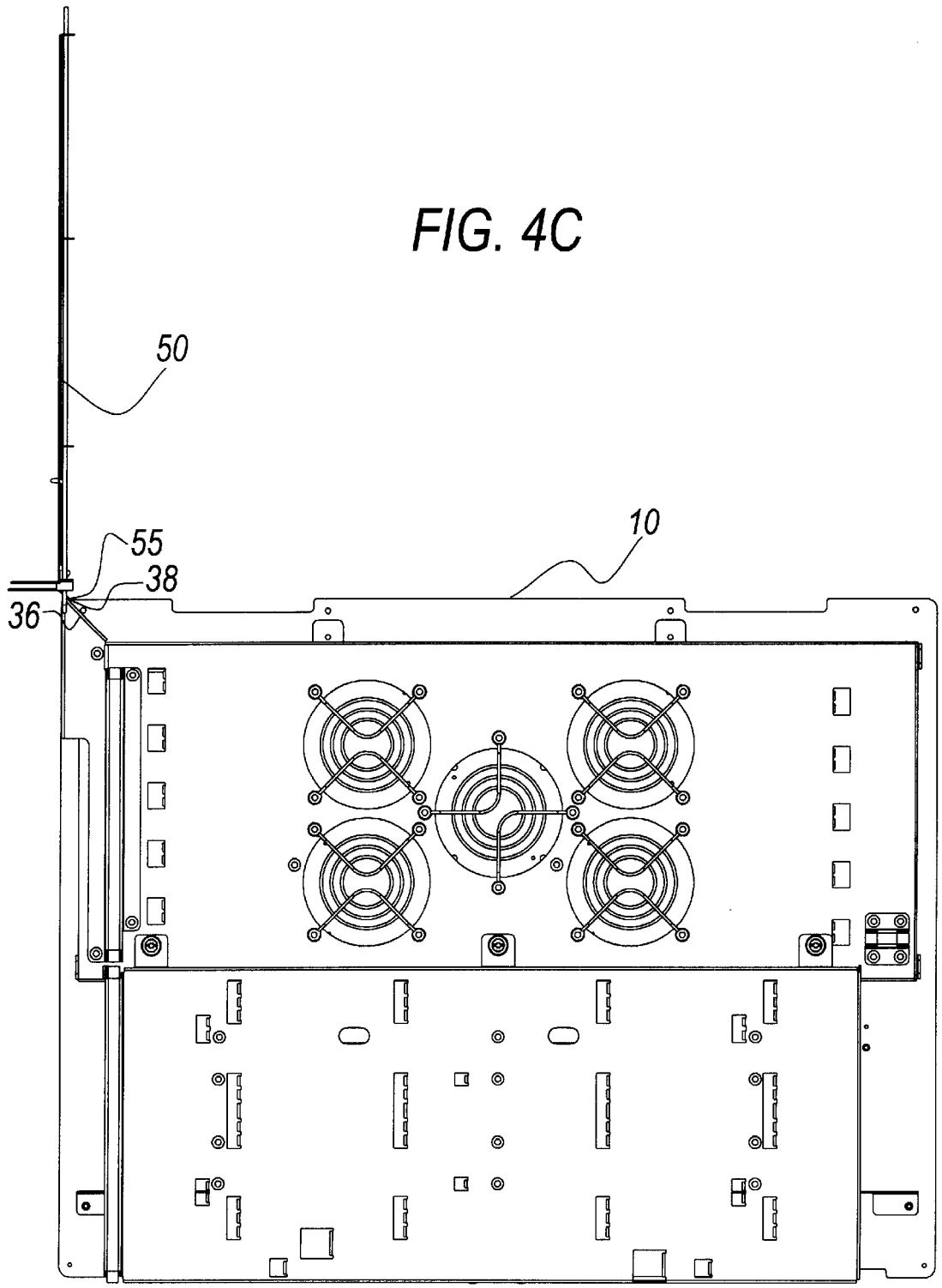
FIG. 4C is a bottom view of a cell board assembly and the damper as the cell board assembly as the cell assembly board engages the actuation hook of the damper.
Figure 4E:
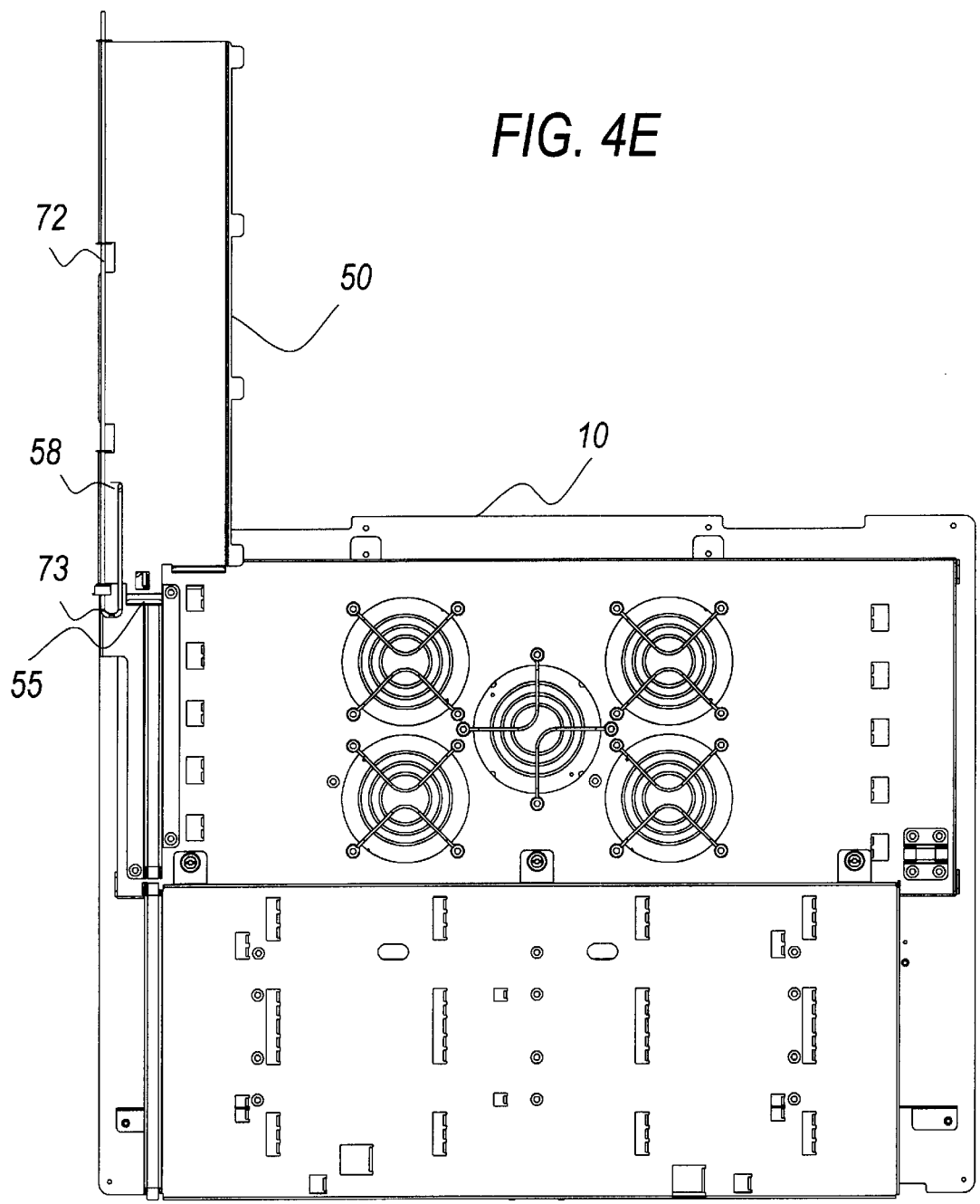
FIG. 4E is a bottom view of a cell board assembly and the damper as the cell board assembly as the cell assembly board is inserted to the point of fully opening the damper.

FIG. 4B is a bottom view of the cell board assembly 10 and damper 50 of slot 4a of FIG. 4A. As illustrated, as the cell board assembly 10 is aligned to the entrance of the slot 4a, the actuation hook 36 of the cell board assembly 10 is aligned to slide under the actuator 55 of the damper 50. FIG. 4C illustrates the cell board assembly 10 and damper 50 as the actuation hook 36 engages the actuator 55 of the damper 50. As shown, the point 38 of the actuation hook 36 slides behind the actuator 55 at an angle such that subsequent insertion force on the cell board assembly 10 in the direction of insertion exerts angular force on the damper actuator 55 by the actuation hook 36, thereby forcing the damper further and further open, as illustrated in FIG. 4D, as the cell board assembly 10 is inserted further and further into the slot until the damper is in the completely open position as shown in FIG. 4E. Accordingly, whenever a slot is empty, its respective damper is maintained in a closed position, preventing airflow through its respective air flow exit opening, until a cell board assembly is inserted in the slot, which actuates the damper to simultaneously open the damper as the assembly is inserted into place.

It will be appreciated from the above detailed description that the self-actuated damper of the invention affords several advantages over the prior art. First, because the damper is automatically closed whenever its corresponding slot is empty, it prevents an air flow bypass created by an empty slot. Second, the damper is self-actuated upon insertion of a cell board assembly into the slot. The cell board assemblies are designed with an actuation hook that engages the actuator of the damper as the cell board assembly is inserted into the slot. Accordingly, no hand actuation or any other slot set-up is required on the part of the operator.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A self-actuating damper for a slot in a cage assembly, comprising:

a damper body; and a damper actuator attached to said damper body which, when engaged by an actuation hook of a cell board assembly upon insertion of said cell board assembly into said slot, changes from a closed position covering an air flow exit opening to an open position allowing free flow of air through said air flow exit opening as said cell board assembly is inserted further into said slot.

2. A self-actuating damper in accordance with claim 1, comprising:

rotation means for rotating said damper body between said closed position and said open position.

3. A self-actuating damper in accordance with claim 1, comprising:

a spring mechanism which holds said damper body in said closed position when said cell board assembly is not inserted in said slot.

4. A cell board assembly which fits into a slot in a cage assembly, comprising:

an actuation hook which engages a damper of said slot as said cell board assembly is inserted into said slot to change a position of said damper from a closed position covering an air flow exit opening to an open position allowing free flow of air through said air flow exit as said cell board assembly is inserted further into said slot.

5. A cell board assembly in accordance with claim 4, wherein:

said actuation hook slides under an actuator of said damper as said actuation hook engages said damper.

6. A cell board assembly in accordance with claim 5, wherein:

said actuation hook is situated at an angle with respect to said damper to thereby exert angular force on said damper as said cell board assembly is inserted further into said slot.

7. A method for actuating a damper located in a slot of a cage assembly, comprising:

engaging an actuator of said damper via an actuation hook on a cell board assembly; and inserting said cell board assembly into said slot.

8. A method in accordance with claim 7, wherein:

said inserting step causes a change in position of said damper from a closed position covering an air flow exit opening to an open position allowing free flow of air through said air flow exit as said cell board assembly is inserted further into said slot.

* * * * *